United States Patent
Jiao et al.

(10) Patent No.: US 8,652,867 B2
(45) Date of Patent: Feb. 18, 2014

(54) MICROMETER-SCALE GRID STRUCTURE BASED ON SINGLE CRYSTAL SILICON AND METHOD OF MANUFACTURING THE SAME

(75) Inventors: Binbin Jiao, Beijing (CN); Dapeng Chen, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 617 days.

(21) Appl. No.: 12/990,037

(22) PCT Filed: Jun. 25, 2010

(86) PCT No.: PCT/CN2010/074447
§ 371 (c)(1),
(2), (4) Date: Dec. 2, 2010

(87) PCT Pub. No.: WO2011/012036
PCT Pub. Date: Feb. 3, 2011

(65) Prior Publication Data
US 2011/0175180 A1    Jul. 21, 2011

(30) Foreign Application Priority Data
Jul. 29, 2009    (CN) .......................... 2009 1 0090124

(51) Int. Cl.
*H01L 21/00*    (2006.01)

(52) U.S. Cl.
USPC ........................................ 438/52; 257/E21.52

(58) Field of Classification Search
USPC ................ 257/418, E29.324, E21.52; 438/52
See application file for complete search history.

(56) References Cited

U.S. PATENT DOCUMENTS

| | | | |
|---|---|---|---|
| 2005/0258514 A1* | 11/2005 | Smith et al. | 257/619 |
| 2007/0138409 A1* | 6/2007 | Daniel | 250/483.1 |
| 2008/0265173 A1* | 10/2008 | Smith et al. | 250/396 R |

* cited by examiner

*Primary Examiner* — William D Coleman
*Assistant Examiner* — Christine Enad
(74) *Attorney, Agent, or Firm* — Morgan, Lewis & Bockius LLP

(57) ABSTRACT

The present invention discloses a micrometer-scale grid structure based on single crystal silicon consists of periphery frame 1 and grid zone 2. The periphery frame 1 is rectangle, and grid zone 2 has a plurality of mesh-holes 3 distributing in the plane of grid zone 2. The present invention also provides a method for manufacturing a micrometer-scale grid structure based on single crystal silicon. According to the present invention thereof, the contradiction between demand of broad deformation space for sensor and actuator and the limit of the thickness of sacrifice layer is solved. Furthermore, the special requirement of double-side transparence for some optical sensor is met.

15 Claims, 4 Drawing Sheets

MICROMETER-SCALE GRID STRUCTURE BASED ON SINGLE CRYSTAL SILICON AND METHOD OF MANUFACTURING THE SAME

TECHNICAL FIELD

The present invention relates to Micro-Electro-Mechanical System (MEMS), more particularly to a micrometer-scale grid structure based on single crystal silicon and a method of manufacturing the same.

BACKGROUND

Micro-Electro-Mechanical System (MEMS) is a new multi-interdisciplinary subject based on integrated circuit technology, which relates to multi engineering and subjects, such as micro electronics, mechanics, automatics, material science and so on.

With the development of science and technology, an increasing need thus exists for array sensation and array operation. Sensor array is used to simultaneously sense a plurality of pieces of information or spatial information distribution via one chip. Actuator array is used to simultaneously perform a plurality of micro-operations so that the efficiency of micro fabrication can be significantly enhanced.

In prior art, MEMS sensor array and actuator array are formed in conventional silicon wafer. A couple of problems are caused as follows by the limited pitch between substrate and detection unit: firstly, the movement space of moveable portion of sensor array or actuator array is limited by the pitch size; secondly, the vacuum demand of response sensitivity of uncooled infrared sensor, which works in a low vacuum environment, is directly affected by the pitch size.

SUMMARY OF THE INVENTION

In order to solve one of these and other foregoing problems, technical advantages are generally achieved by embodiments of the present invention, which provide a micrometer-scale grid structure based on single crystal silicon and a method of manufacturing the same. The method of manufacturing sensor array or detector array on silicon based grid may effectively solve the problems.

In accordance with one aspect of the present invention, a micrometer-scale grid structure based on single crystal silicon consists of periphery frame (1) and grid zone (2). The periphery frame (1) is rectangle, including square, and grid zone (2) has a plurality of mesh-holes (3) distributing in the plane of grid zone (2).

In accordance with another aspect of the present invention, a method for manufacturing a micrometer-scale grid structure based on single crystal silicon comprises following steps:

Step a): Etch trenches on the top surface of a single crystal silicon wafer;

Step b): Deposit a first material on the top surface of the silicon wafer so as to fill the trenches and simultaneously form a thin film on the top surface of the silicon wafer.

Step c): Flat the top surface of the silicon wafer which is covered by the thin film;

Step d): Pattern and etch the thin film so as to form grid pattern;

Step e): Etch the bottom surface of the silicon wafer until the first material filled in the trenches is exposed;

Step f): Dry etch the top surface of the silicon wafer so as to form grid structure.

The process of etching the thin film in step d) comprises: etching part of the thin film between the neighboring trenches by the mask with designed pattern. The process of dry etching the top surface of the silicon wafer in step f) comprises: performing dry etch to the portion of silicon wafer which is uncovered by the thin film by the mask with designed pattern.

In another embodiment of the present invention, step g) and step h) may be further included based on the foregoing embodiment.

Step g: Remove the thin film remains on the grid structure;
Step h: Deposit a second material on the grid structure.

Thus, the technical advantages of the present invention can be described as follows:

1. The hollowed-out gird structure meets the demand of broader movement space for some sensors or actuators without sacrifice layer structure;
2. Advantages of the hollowed-out grid structure meet the demand of double-side transparence for some optical sensors;
3. The structure of the present invention may be used as cell sieve in biochemistry field.

BRIEF DESCRIPTION OF THE DRAWINGS

For a more complete understanding of the present invention, and the advantages thereof, the following descriptions are made in conjunction with the accompanying drawing, in which.

The drawings, schematics and diagrams only are illustrative, not intended to be limited but are examples of embodiments of the invention, are simplified for explanatory purposes, and are not drawn to scale.

DETAILED DESCRIPTION OF ILLUSTRATIVE EMBODIMENTS

The manufacturing and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
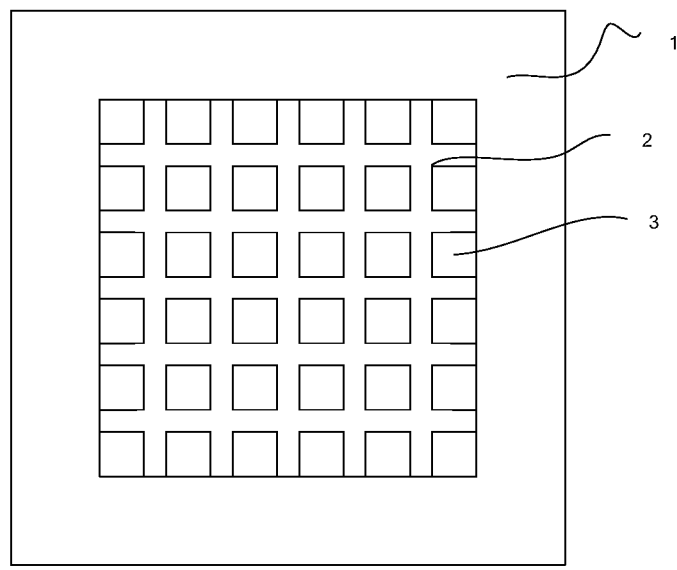
FIG. 1 shows a top view of the micrometer-scale grid structure based on single crystal silicon according to an embodiment of the invention.
Figure 2:
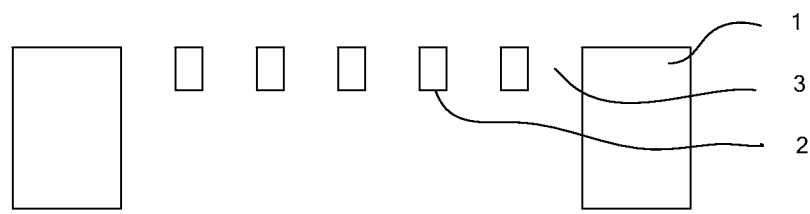
FIG. 2 shows a cross section view of the micrometer-scale grid structure based on single crystal silicon according to an embodiment of the invention.
Figure 3:
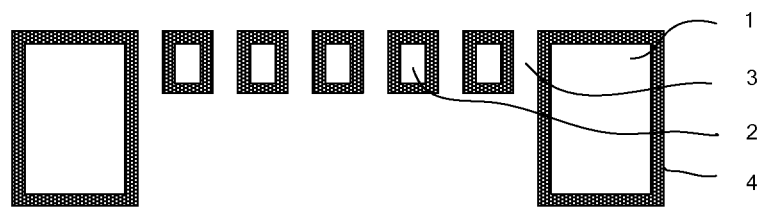
FIG. 3 shows a cross section view of the micrometer-scale grid structure with a passivated layer and based on single crystal silicon according to an embodiment of the invention.

The present invention is directed to a micrometer-scale grid structure based on single crystal silicon that is manufactured by micro-fabrication. The micrometer-scale grid structure comprises periphery frame (1) and grid zone (2), as shown in a top view (FIG. 1). The periphery frame (1) is a rectangle, of course including square, of which the length and width range from 1 mm to 100 mm. There are multiple mesh-holes (3) in grid zone (2), which are distributed in the plane of grid zone (2). The shape of the mesh-hole (3) may be triangle, rectangle, square or arbitrary polygon, while FIG. 1 takes square for example. The side length of mesh-holes (3) ranges from 0.1 microns to 1000 microns. The space between two neighbouring mesh-holes is grid beam, the width of which ranges from 0.1 microns to 20 microns. The cross section view of the grid structure shown in FIG. 2 illustrates that the cross section of the grid beam is rectangle, the height (length) of which ranges from 0.1 microns to 1000 microns. Furthermore, in order to meet application requirement, the grid beam may be covered by a passivated material such as silicon nitride (SiNx), silicon oxide (SiO2) or silicon carbon (SiC), as shown in FIG. 3.

Figure 4:
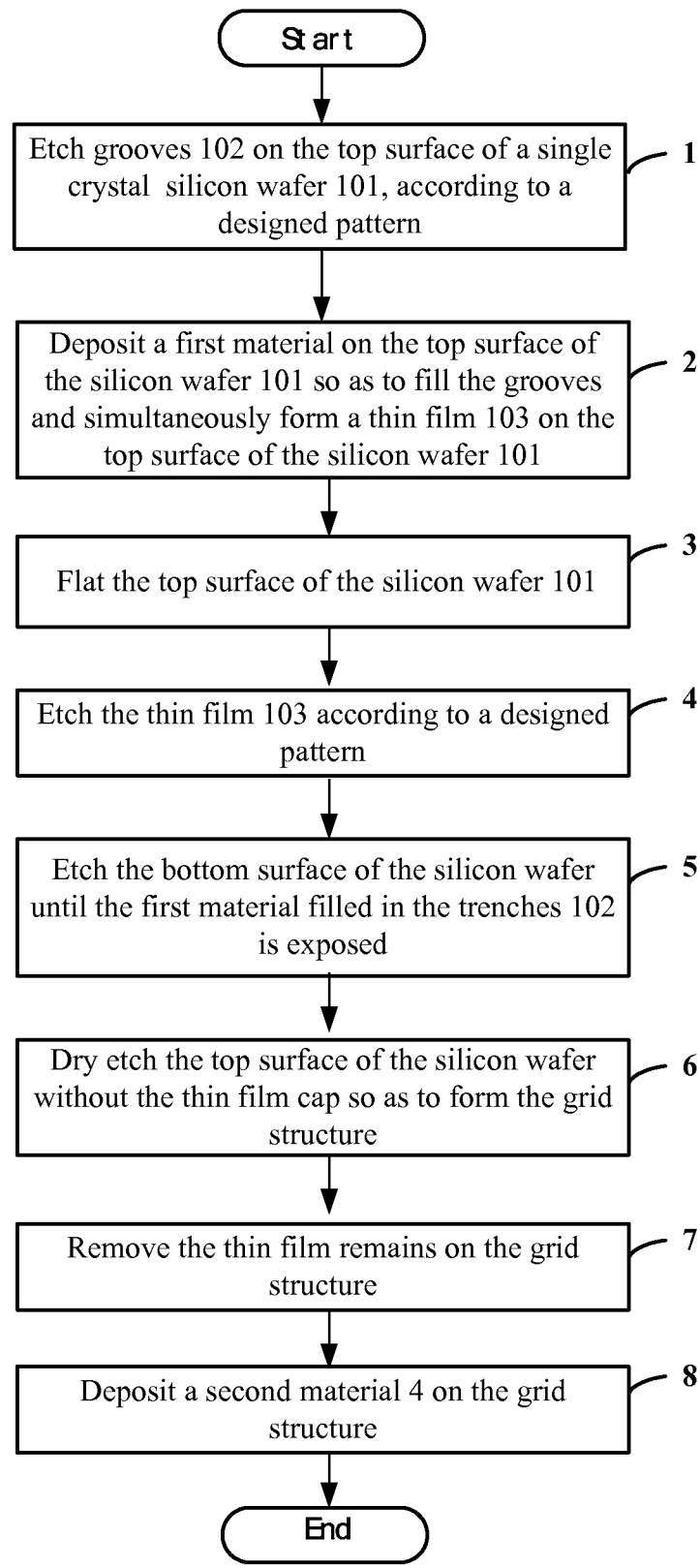
FIG. 4 shows a schematic flow chart of a method for manufacturing the micrometer-scale grid structure based on single crystal silicon.
Figure 5:
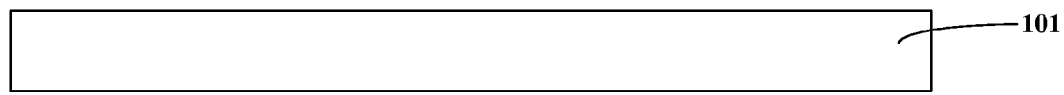
FIG. 5-13 shows schematic structure view of process flow of manufacturing the micrometer-scale grid structure based on single crystal silicon, respectively.
Figure 6:
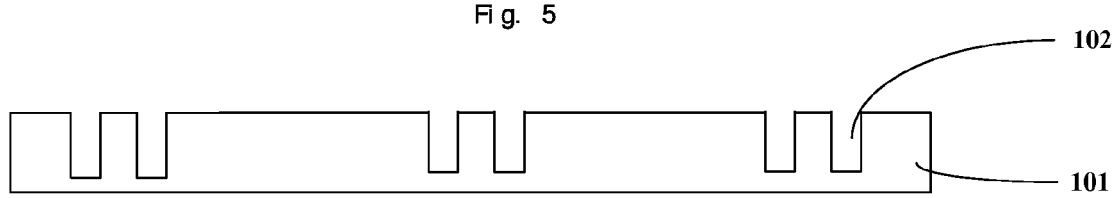

Referring now to FIG. 4, a schematic flow chart is shown illustrating a method for manufacturing the micrometer-scale grid structure based on single crystal silicon, which may comprise following steps:

Step a): According to a designed pattern, etch trenches 102 on the top surface of single crystal silicon wafer 101, as shown in FIG. 5 and FIG. 6. Both p-type and n-type silicon wafer with crystal orientation <100> are preferred. Since that of the grid beam thickness is depended on the etching depth of the groove, the grid thickness can be better controlled by the present method.

Silicon oxide may be used as hard mask taken in conjunction with reaction ion etch (RIE) or inductively coupled plasma (ICP) to perform anisotropic deep silicon dry etching, followed by etching the hard mask via HF solution or buffer solution BOE thereof.

Figure 7:
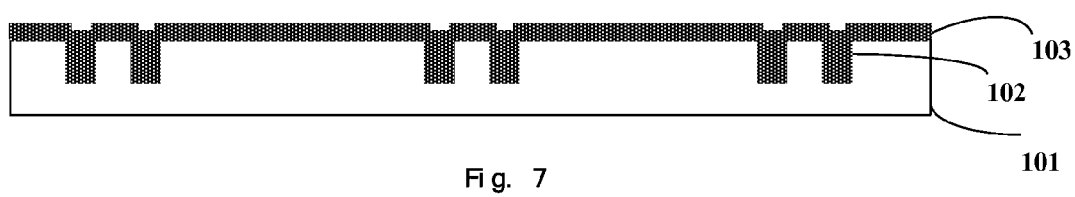

Step b): Deposit a first material on the top surface of the silicon wafer 101 to fill the trenches 102 and simultaneously form a thin film 103 on the top surface of the silicon wafer, as shown in FIG. 7. For convenience's sake, only small portion of the structure is shown in the figure, and the same case occurs to all of following figures.

The deposition of the first material may be realized via low pressure chemical vapor deposition (LPCVD). The first material may include silicon oxide, phosphosilicate glass (PSG) or borophosphosilicate glass (BPSG).

Figure 8:
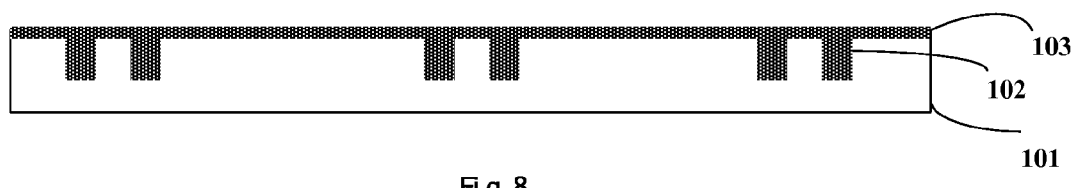

Step c): Flat the top surface of the silicon wafer, as shown in FIG. 8. The planarization may be achieved via chemical mechanical planarization (CMP) or high-temperature reflow with processing temperature ranging from 200° C. to 700° C.

Figure 9:
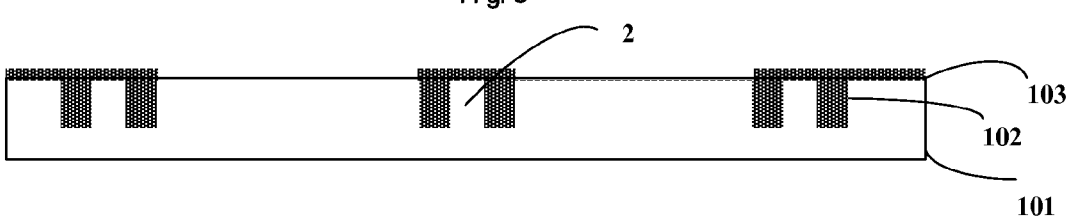

Step d): Etch the thin film 103 on the top surface of the silicon wafer according to designed pattern, as shown in FIG. 9. Because grid zone (2) is the grid beam to be formed, the first material attached on the side walls of grid zone (2) should be remained as hard mask. Thus, etch the part of the thin film between neighbouring trenches by a mask with designed pattern so as to form the structure shown in FIG. 9. This etching process may be conducted via RIE.

Figure 10:
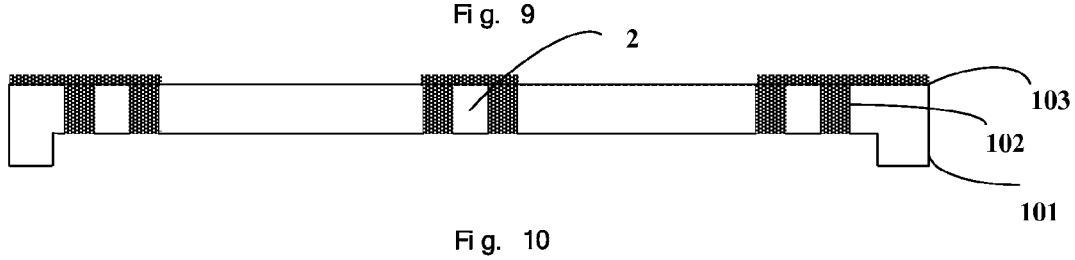

Step e): Etch the bottom surface of the silicon wafer until the first material filled in the trenches 102 is exposed, as shown in FIG. 10. KOH solution or TMAH solution may be used as etchant solution.

Step f): Dry etch the top surface of the silicon wafer without the thin film cap so as to form the grid structure as shown in FIG. 11, which may be conducted via dry chemical etching with xenon difluoride ($XeF_2$) or via deep silicon dry etch with ICP.

Figure 11:
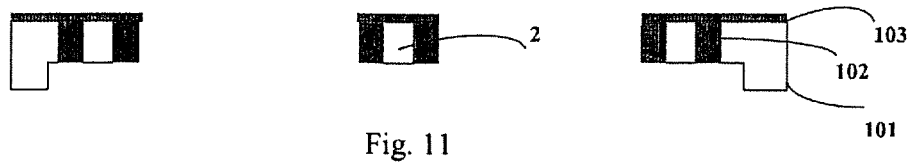

The final grid structure as shown in FIG. 11, which consists of single crystal silicon and the first material, is completed up to now. The first material may be silicon oxide($SiO_2$), PSG or BPSG that is deposited on the surface of silicon wafer via LPCVD.

Furthermore, the improved grid structure is provided to meet some special requirement. Thus, in another exemplary embodiment, step g) and step h) further follows the foregoing six steps.

Figure 12:
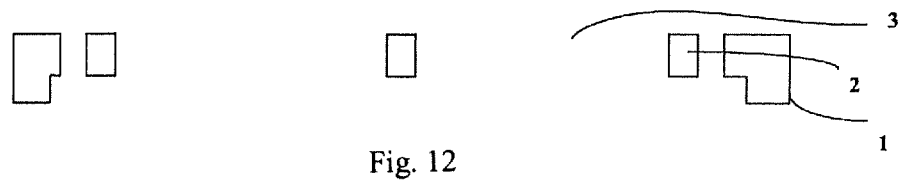

Step g): Remove the thin film remains on the grid structure via wet etch with HF or buffer solution BOE thereof, as shown in FIG. 12.

Figure 13:
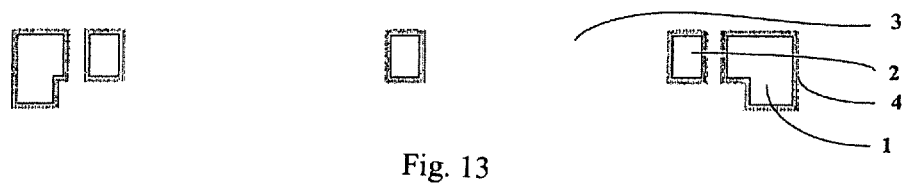

Step h): Deposit the second material 4 on the grid structure, as shown in FIG. 13. For convenience's sake, only two mesh-holes are shown in FIG. 13. For the top view of the whole grid structure, kindly refer to FIG. 1.

Wherein, the second material 4 may be a passivated material, such as silicon nitride, silicon oxide or silicon carbon, which is deposited via LPCVD. The second material may be deposited to cover the whole surface of the grid structure as shown in FIG. 13. Optionally, in order to meet process requirement, the second material may be deposited to cover the top surface, bottom surface or side surface of the grid structure.

The embodiments of the present invention have several advantageous features. Firstly, grid structure within micrometer scale is achieved so that MEMS unit array or actuator array, such as sensor or detector, which is set up on the grid beam of grid structure, may substantially broaden the movement space of device and thus meet the demand of broader movement space for some sensors or actuators without depending on sacrifice layer structure. Additionally, the feature of such hollowed-out grid structure meets the demand of double-side transparence for some optical sensors. Furthermore, the structure of the present invention may be used as cell sieve in biochemistry field. For instance, proper mesh depended on cell size to be sieved can be obtained by the present method.

Although embodiments of the present invention and its advantages have been described in detail, it should be understood that various changes, substitutions and alterations can be made herein without departing from the spirit and scope of the invention as defined by the appended claims. For example, it will be readily understood by those skilled in the art that the methods may be varied while remaining within the scope of the present invention.

Moreover, the scope of the present application is not intended to be limited to the particular embodiments of the methods and steps described in the specification. As one of ordinary skill in the art will readily appreciate from the disclosure of the present invention, processes, or steps, presently existing or later to be developed, that perform substantially the same function or achieve substantially the same result as the corresponding embodiments described herein may be utilized according to the present invention. Accordingly, the appended claims are intended to include within their scope such processes or steps.

What is claimed is:

1. A method of manufacturing a micrometer-scale grid structure based on single crystal silicon, comprising:
   Step a): Etching trenches on the top surface of a single crystal silicon wafer;
   Step b): Depositing a first material on the top surface of the silicon wafer so as to fill the trenches and simultaneously forming a thin film on the top surface of the silicon wafer;
   Step c): Flatting the top surface of the silicon wafer which is covered by the thin film;
   Step d): Etching the thin film according to a designed pattern;
   Step e): Etching the bottom surface of the silicon wafer until the first material filled in the trenches exposed;
   Step f): Dry etching the top surface of the silicon wafer so as to form the grid structure;
   Step g): Removing the thin film remains on the grid structure; and
   Step h): Depositing a second material on the grid structure.

2. The method of claim 1, wherein the single crystal silicon wafer mentioned in step a) is p-type or n-type silicon wafer with crystal orientation <100>.

3. The method of claim 1, wherein step a) comprises taking silicon oxide as hard mask; anisotropic deep silicon dry etching via reaction ion etch RIE or inductively coupled plasma ICP; etching the hard mask via HF solution or buffer solution BOE thereof.

4. The method of claim 1, wherein step b) is conducted via low pressure chemical vapor deposition LPCVD; and the first material includes silicon oxide, phosphor silicon glass PSG or boron phosphor silicon glass BPSG.

5. The method of claim 1, wherein step c) is conducted via chemical mechanical planarization CMP or high-temperature reflow with a processing temperature range from 200° C. to 700° C.

6. The method of claim 1, wherein the process of etching the thin film mentioned in step d) is conducted via RIE.

7. The method of claim 1, wherein KOH solution or TMAH solution in step e) is used as etchant solution.

8. The method of claim 1, wherein step f) is conducted via dry chemical etching with xenon difluoride, or via deep silicon dry etching with ICP.

9. The method of claim 1, wherein step g) is conducted via wet etching with HF or buffer solution BOE thereof.

10. The method of claim 1, wherein step h) is conducted via low pressure chemical vapor deposition LPCVD; the second material including passivated material such as silicon nitride, silicon oxide or silicon carbon.

11. The method of claim 1, wherein step d) comprises: etching part of the thin film between neighboring trenches by the mask with designed pattern.

12. The method of claim 11, wherein step f) comprises: dry etching the portion of silicon wafer which is uncovered by the thin film.

13. A method of manufacturing a micrometer-scale grid structure based on single crystal silicon, comprising:
   Step a): Etching trenches on the top surface of a single crystal silicon wafer;
   Step b): Depositing a first material on the top surface of the silicon wafer so as to fill the trenches and simultaneously forming a thin film on the top surface of the silicon wafer;
   Step c): Flatting the top surface of the silicon wafer which is covered by the thin film;
   Step d): Etching the thin film according to designed pattern;
   Step e): Etching the bottom surface of the silicon wafer until the first material filled in the trenches exposed; and
   Step f): Dry etching the top surface of the silicon wafer so as to form the grid structure.

14. The method of claim 13, wherein step d) comprises: etching part of the thin film between neighboring trenches by the mask with designed pattern.

15. The method of claim 14, wherein step f) comprises: dry etching the portion of silicon wafer which is uncovered by the thin film.

* * * * *